(12) United States Patent
Moore et al.

(10) Patent No.: US 7,867,633 B2
(45) Date of Patent: Jan. 11, 2011

(54) COATINGS FOR GLASS MOLDING DIES AND FORMING TOOLS

(75) Inventors: John Moore, Evergreen, CO (US);
Dalong Zhong, Niskayuna, NY (US);
Jianliang Lin, Golden, CO (US)

(73) Assignee: Colorado School of Mines, Golden, CO (US)

( * ) Notice: Subject to any disclaimer, the term of this patent is extended or adjusted under 35 U.S.C. 154(b) by 968 days.

(21) Appl. No.: 11/147,809

(22) Filed: Jun. 6, 2005

(65) Prior Publication Data

US 2005/0268662 A1 Dec. 8, 2005

Related U.S. Application Data

(60) Provisional application No. 60/578,013, filed on Jun. 7, 2004.

(51) Int. Cl.
*B32B 9/00* (2006.01)
(52) U.S. Cl. .................. 428/698; 51/307; 51/309; 428/216; 428/336; 428/472; 428/697; 428/699
(58) Field of Classification Search .................. 51/307, 51/309; 428/216, 336, 472, 697, 698, 699
See application file for complete search history.

(56) References Cited

U.S. PATENT DOCUMENTS

| | | | |
|---|---|---|---|
| 4,239,536 A | 12/1980 | Yamamoto et al. | |
| 4,732,602 A | 3/1988 | Dakan et al. | |
| 4,746,563 A * | 5/1988 | Nakano et al. | 428/216 |
| 5,306,339 A | 4/1994 | Takeda et al. | |
| 5,405,652 A | 4/1995 | Kashiwagi et al. | |
| 5,538,528 A | 7/1996 | Kashiwagi et al. | |
| 5,676,723 A | 10/1997 | Taniguchi et al. | |
| 5,915,162 A * | 6/1999 | Uchino et al. | 428/698 |
| 6,119,485 A | 9/2000 | Hibino et al. | |

(Continued)

FOREIGN PATENT DOCUMENTS

JP 59-121126 7/1984

(Continued)

OTHER PUBLICATIONS

English language translation of KR 20030052468.*

(Continued)

*Primary Examiner*—Archene Turner
(74) *Attorney, Agent, or Firm*—Sheridan Ross, P.C.

(57) ABSTRACT

The invention provides coatings to achieve the best accommodation of chemical, physical, and mechanical properties desired in high performance and reliable glass molding and forming tools. The substrate material can be any ordinary die or tool material such as cast iron, stainless steel, platinum, tungsten carbide and silicon. A simple coating architecture consisting of a titanium adhesion layer and a Ni—Al—N or Ti—B—C—N working layer is provided. A NiAl working layer can meet the requirements of wear resistance in which abrasive and/or erosive wear is relatively low, while a Ti—B—C—N working layer is sufficient for processes operating at relatively low temperature or in vacuum or a protective environment. The coating architectures, from the coating/substrate interface to the outer most surface of the coating include an inner adhesion layer, an outer working layer and, optionally, one or more functionally graded material layers. The invention also provides methods of making these coatings.

49 Claims, 1 Drawing Sheet

(a)

(b)

U.S. PATENT DOCUMENTS 6,574,992 B1  6/2003  Kuster et al.

FOREIGN PATENT DOCUMENTS

| JP | 11-157852 | | 6/1999 |
| JP | 2001-269801 | | 10/2001 |
| KR | 20030052468 | * | 6/2003 |
| KR | 20030062049 | * | 7/2003 |

OTHER PUBLICATIONS

English language translation of KR 20030062049.*
International Search Report for International (PCT) Patent Application No. PCT/US05/19985, mailed Jul. 24, 2008.
Written Opinion for International (PCT) Patent Application No. PCT/US05/19985, mailed Jul. 24, 2008.

* cited by examiner

COATINGS FOR GLASS MOLDING DIES AND FORMING TOOLS

CROSS REFERENCE TO RELATED APPLICATION

This application claims priority under 35 U.S.C. § 119(e) to U.S. Provisional Patent Application Ser. No. 60/578,013 filed Jun. 7, 2004, which is incorporated herein in its entirety by this reference.

FIELD OF THE INVENTION

The invention resides in the field of die and tool materials used in glass molding dies and forming tools and specifically to coating systems that improve the performance, reliability and life of these dies and tools.

BACKGROUND OF THE INVENTION

Die materials used extensively by the glass industry include metallic mold materials, such as cast iron, stainless steel (e.g., AISI 431 stainless steel), cast bronze, metallic alloys (e.g., Ni-based alloys), and precious metals (e.g., Pt). These glass molding dies and forming tools operate in air and at elevated temperatures (up to 1000° C.), while the working surface is exposed to the chemically active molten glass and subjected to thermomechanical cyclic operations. These severe process conditions result in three critical problems with respect to the performance and reliability of glass molding dies: oxidation, sticking/adhesion by molten glass, and wear.

Furthermore, modern glass-making process requirements have placed a greater demand on the performance of materials used for glass molding dies and forming tools. For instance, glass quality requirements are greater, process temperatures are higher, closer control of dimensional tolerances is desired, longer service life is expected, and higher productivity has become an economic necessity. All of these requirements have pushed the demands on the properties and performance of die materials to higher and higher levels.

In recent years, efforts have been directed to enhance the performance of glass molding dies and forming tools, and to improve the quality of glass products. One method to improve the performance of glass molding dies is optimization of chemical composition and structure of die materials themselves. Another effort has been made to identify new potential mold materials. For instance, the replacement of cast iron by steels, non-ferrous alloys, sintered ceramics, and composites. However, the replacement of conventional die materials does not always ensure success because there are accompanying changes in the physical, mechanical, chemical and operational characteristics responsible for determining tool reliability and life.

The problem associated with the metallic die materials such as stainless steel and various refractory alloys, is their poor resistance to oxidation at temperatures exceeding 600° C. Glass molding using a die made of such metallic materials must be conducted in an atmosphere protected with nitrogen gas. Therefore, the forming tools made of these metallic materials have reduced durability and lower productivity.

To improve the press-molding dies, a die composed of cemented carbides (WC) coated with a thin layer of nickel-precious metal alloy was proposed in a Japanese Unexamined Patent Publication No. SHO 64-61327. Although the proposed die is superior in mechanical strength and easy to process, it still has the disadvantage that the highest working temperature is 600° C. because of its poor oxidation resistance and adhesion/sticking to molten glass.

Other ceramic dies include, for example, a die of mixed materials including titanium carbide (TiC) and a metal, as disclosed in Japanese Unexamined Patent Publication No. SHO 59-121126. Although a die made of TiC and a metal is hard and mechanically strong, it is very difficult to machine the dies precisely. In addition, the die has the problem of reacting with components of glass, such as lead or alkaline metals.

As disclosed in U.S. Pat. No. 5,306,339, a ceramic die for glass molding characterized by having the press surfaces formed of boron type composite ceramics comprising (1) at least one MB ceramic phase (wherein M is Ni, Cr, V, Nb, Ta, Mo, W or Mn) having a M/B atomic ratio of 1/1 and (2) at least one Group IV diboride ceramic phase selected from $TiB_2$, $ZrB_2$, or $HfB_2$, and/or a $(Cr,Ni)_3B_4$ ceramic phase. This glass molding die was reported to produce enhanced glass productivity in the open air at elevated temperatures up to 750° C. Nevertheless, if the highest process temperature is required to be greater than 750° C. for some glasses, this type of die made of diborides will be deficient in resistance to oxidation.

Another method of increasing the life and performance of glass molding dies and tools includes surface modifications and coatings that are gaining increasingly widespread industrial acceptance as one of the most important and versatile means of improving component performance, particularly as a means of providing improvements in tool reliability, service life and product quality.

U.S. Pat. No. 5,405,652, to Kashiwagi et al. discloses a method of manufacturing a die for use in molding glass optical elements by sputter coating of platinum and iridium noble metal alloys. These dies were compared with those made of SiC sintered material, and it was demonstrated that the noble metal die coatings were superior with respect to glass adhesion problems, however, the price of the die was increased dramatically. On the other hand, the test was carried out only in a nitrogen atmosphere and the highest glass temperature was only 500° C. In practice, there are a large number of glass forming processes requiring higher temperatures and operating in air.

For production of a glass substrate for a magnetic disk that is suitable as a recording medium, a press-molding die, according to U.S. Pat. No. 6,119,485, comprises a base material, an intermediate layer formed on the surface of the base material and a protective layer formed on the intermediate layer. The base material has an inorganic oxide such as silicon oxide or aluminum oxide. The intermediate layer includes a material which adheres to both the base material and the protective layer and the protective layer has at least one metal film consisting of tungsten (W), platinum (Pt), palladium (Pd), ruthenium (Ru), iridium (Ir), Osmium (Os), rhenium (Re), tantalum (Ta) or alloys of these materials.

A similar press-molding die is disclosed in U.S. Pat. No. 5,538,528. The invention provides a die for press-molding a glass optical element having a base material and a tantalum-containing alloy thin layer on the surface. The sintered base material has at least one material such as tungsten carbide (WC), titanium carbide (TiC), or titanium nitride (TiN). The 1 to 5 μm tantalum (Ta)-containing alloy thin layer contains Ta and at least one other element such as platinum (Pt), rhodium (Rh), iridium (Ir), ruthenium (Ru), osmium (Os), rhenium (Re), tungsten (W), and palladium (Pd). These two inventions provide a press-molding die with high precision and little deterioration in manufacturing magnetic disk substrates and optical glass elements. There is no disclosure of the limitations of these inventions as far as process temperature and adhesion between glass and die are concerned. However, it is apparent that it is not an economically sound approach to use these precious and rare earth elements selected in the inventions, especially for a large glass molding die or forming tools.

Some coating materials have been studied for glass molding dies, e.g., plasma nitrided coatings, galvanic plated chromium coating, paint-on ceramic coatings, such as $Si_3N_4$, SiC and BN, and PVD-produced AlN, TiN, TiAlN coatings. Although TiAlN coated dies have clearly shown lower wear and deterioration than uncoated tool surfaces, sticking of molten glass to the TiAlN coated dies was not decreased. In comparison with the other materials, BN-coated mold specimens showed desirable non-sticking behavior by the glass melt in the temperature range between about 500° C. and about 750° C. Similar results have been obtained by the synthesis of BN thin films by ion beam and vapor deposition (IVD) processes. The films were multilayered BN films, in which B-rich BN films were formed on the substrate, and stoichiometric films were deposited on the B-rich BN films. This showed excellent tribological properties of the multilayered BN coated WC molding die for forming borosilicate glass lenses at 630° C. Measurements of contact angles of Duran glass (corresponding to the International Standard "Borosilicate glass 3.3" according to ISO/DIN 3585) on hexagonal boron nitride both in air and in vacuum have been conducted by the present inventors. Boron nitride showed promising non-sticking behavior by glass in vacuum. However, during experiments conducted in air, the formation of bubbles in the molten glass were observed at 950° C., and grew with increasing temperature. The bubbles broke at a certain size, and then new bubbles grew. It is believed that the formation of bubbles is due to the oxidation of BN and the release of $B_2O_3$ gas. As a result, the wetting of boron nitride by glass accelerated. Thus, boron nitride is not a suitable coating material for glass molding dies to operate at a process temperature higher than 900° C.

The progress made in recent years to improve the performance of glass molding dies has largely been concerned with solving only one or two aspects of the problems associated with glass molding dies. None of the solutions proffered thus far has fulfilled all the characteristics that the glass molding dies and forming tools are required to possess. Thus, there exists a need for glass molding dies and forming tools that do not stick to the molten glass, possess high oxidation resistance, high wear resistance, low coefficients of friction and high thermal shock resistance (thermal fatigue resistance).

SUMMARY OF THE INVENTION

The invention is a coating well suited to protecting and enhancing the desirable physical characteristics of tools and dies, and particularly tools and dies used in glass molding processes, as well as methods of making and applying these coatings. In one embodiment the coating includes an outer working layer containing Ni—Al—N and/or Ti—B—C—N and an adhesion layer that makes contact with a surface of a die or tool. In a preferred embodiment, the coating also contains at least one functionally graded intermediate layer between the outer working layer and the inner adhesion layer.

The working layer typically has a thickness between about 0.25 micrometers and about 5 micrometers, and more preferably, between about 0.5 micrometers and about 2 micrometers. In one embodiment, the working layer contains a nickel aluminum (NiAl) intermetallic film. In another embodiment, the coating contains a titanium-boron-carbide-nitrogen (Ti—B—C—N) composite film. Preferably, the working layer is a NiAl intermetallic film.

The adhesion layer is a layer of at least one reactive element, such as, but not limited to, titanium, chromium and/or tungsten. The adhesion layer typically has a thickness of between about 25 nanometers and about 200 nanometers, and more preferably, between about 50 nanometers and about 100 nanometers.

The graded interlayer(s) contain at least one functional graded material (FGM) layer such as a Ti—B—C—N composite and a nickel-aluminum-nitrogen (Ni—Al—N) composite material. The graded interlayer(s) preferably have a nitrogen content in the film that is graded from about 0% nitrogen to about 20 atomic % nitrogen for a Ni—Al—N composite, and about 30 atomic % nitrogen for a Ti—B—C—N composite, respectively. Preferably, the graded nitrogen content varies linearly or sinusoidally across the graded interlayer. The coatings preferably contain at least one graded interlayer having a composite material such as a Ti—B—C—N and/or a Ni—Al—N composite. Preferably, the nitrogen content of these composites is graded from about 0% nitrogen at the surface of the interlayer closest to the working layer to the higher content of nitrogen at the surface of the interlayer closest to the adhesion layer. Preferably, the graded interlayer contains both a Ti—B—C—N composite layer and a Ni—Al—N composite layer, and the nitrogen content of each composite layer is graded from about 0% nitrogen at the surface of the interlayer closest to the working layer to the higher content of nitrogen at the surface of the interlayer closest to the adhesion layer. Thus, the interlayer typically contains at least one TiBCN, TiBC, NiAlN or NiAl composite. The graded interlayer typically has a thickness of between about 0.25 micrometers and about 10 micrometers, and preferably has a thickness of between about 0.5 micrometers and about 5 micrometers.

One embodiment of the present invention is a die coated with an outer working layer containing Ni—Al—N and/or Ti—B—C—N and an adhesion layer that makes contact with a surface of the die. In a preferred embodiment, the coating on the die also contains at least one functionally graded intermediate layer between the outer working layer and the inner adhesion layer. Preferably, the die is a glass molding die.

One embodiment of the present invention is a tool coated with an outer working layer containing Ni—Al—N and/or Ti—B—C—N and an adhesion layer that makes contact with a surface of the tool. In a preferred embodiment, the coating on the tool also contains at least one functionally graded intermediate layer between the outer working layer and the inner adhesion layer. Preferably, the tool is a glass molding tool.

Another embodiment of the invention is a method of sputtering from a composite target, such as a $TiB_2$—TiC composite or a NiAl compound, in an argon-nitrogen atmosphere. In this method, the nitrogen content in the argon-nitrogen atmosphere may be continuously changed to form a functionally graded material layer containing at least one of Ti—B—C—N and NiAl, on a substrate. In this method, the nitrogen content may be changed during the sputtering from about ten percent nitrogen to about zero percent nitrogen. Preferably the nitrogen content is changed in a continuous linear or sinusoidal manner. In the embodiment in which the composite target is a $TiB_2$—TiC composite target, the composite target preferably contains a $TiB_2$:TiC ratio of between about 40:60 to about 80:20. The sputtering used in this method may be RF magnetron sputtering, DC magnetron sputtering, pulsed unbalanced magnetron sputtering, pulsed closed field unbalanced magnetron sputtering or combinations of these techniques. The substrate used in this method is preferably a tool or die for glass molding.

DETAILED DESCRIPTION OF THE INVENTION

Figure 1:
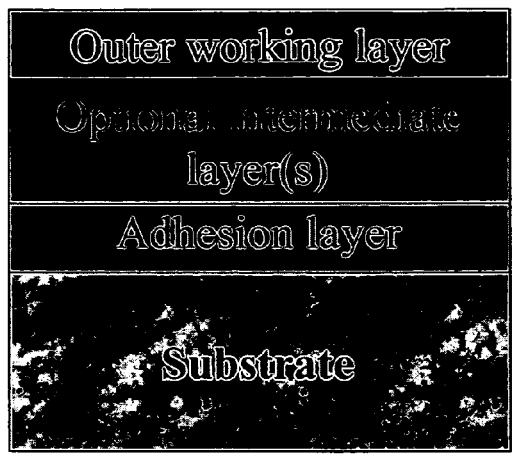
FIG. 1 is a schematic of a design methodology of the present invention used to develop a coating architecture for tools and dies. The figure shows an outer working layer that provides non-sticking (by molten glass), oxidation-resistance, and wear-resistance characteristics; optional intermediate layer(s) that enhance the wear properties and accommodate residual stresses; the adhesion layer; and the substrate.

There is currently no single coating that can simultaneously provide the best accommodation of chemical, physical, and mechanical properties desired to achieve high performance and reliability for glass forming applications. To accomplish these objectives, the present invention provides new methodologies based on the concept of a functionally graded coating system. A suitable non-sticking (by molten glass), oxidation-resistant and wear-resistant working layer has been identified. This is combined with an optimized coating architecture built to cope with the stresses induced by the repeated heating and cooling of the tool, and thus enhance the performance and reliability of the coating system during service. One of the new design methodologies for coatings used on dies and tools is depicted schematically in FIG. 1. The coating depicted there is particularly well suited for coating the surface of tools and dies used to mold glass.

Thus, the coatings of the present invention include an inner adhesion layer that makes contact with a substrate tool or die and an outer working layer having good non-wettability and non-sticking characteristics. Preferably, the coatings also contain at least one intermediate layer of a compositional, functionally graded material (FGM). These FGM interlayers may be include a Ti—B—C—N compositional FGM layer or a Ni—Al—N compositional FGM layer. Preferably, the coatings are applied to a tool or die used in glass molding processes. In this instance, the working layer is the upper-most layer of a coating that makes contact with the molten glass, and the FGM interlayers are located between the adhesion layer and the working layer.

One embodiment of the present invention is a method of forming a coating system with an optimum combination of functionality to meet the chemical, physical, and mechanical requirements for glass molding dies and forming tools.

Based on their physical, chemical and mechanical properties, thin films containing Ni—Al—N and Ti—B—C—N composites are used as the outer-most or "working layers" for the coatings of the present invention. The Ni—Al—N and Ti—B—C—N thin films are deposited from a NiAl compound and $TiB_2$—TiC composite targets (in which the $TiB_2$:TiC ratio can vary from about 40:60 to about 80:20) in different argon-nitrogen sputtering atmospheres using RF magnetron sputtering. These coatings can be produced using any vapor deposition techniques such as physical vapor deposition (PVD) or chemical vapor deposition (CVD). For example, DC magnetron sputtering and other PVD techniques may also be used to produce these coatings including pulsed unbalanced magnetron sputtering and pulsed closed field unbalanced magnetron sputtering.

Using X-ray photoelectron spectroscopy (XPS) and Auger electron spectroscopy (AES), the stoichiometry of these thin films has been investigated. Additionally, X-ray diffraction (XRD), scanning electron microscopy (SEM), and transmission electron microscopy (TEM) were used to characterize the structure of these thin films. NiAl and Ti—B—C films of approximately the same compositions as the composite targets were obtained by sputtering these targets in argon. Increasing the nitrogen content in the sputtering gas from about 5 percent to about 20 percent, the relative atomic concentration of nitrogen in the films varied from about 9 to about 30 atomic percent in the Ni—Al—N films, but fixed at approximately 30 atomic percent in the Ti—B—C—N films. Introducing nitrogen into the sputtering gas results in the formation of AlN in the Ni—Al—N films, and TiN in the Ti—B—C—N films. The NiAl films exhibit a typical dense columnar crystalline microstructure. Quasi-amorphous nano-composite Ti—B—C, Ti—B—C—N and Ni—Al—N films were deposited using a RF power density of 11.2 W/cm$^2$ and a substrate bias of −50 volts.

The wetting properties by molten glass, including contact angles, critical wetting temperatures, adhesion energies of glass/film systems, were determined for these working layers using a sessile drop technique. The non-wettability by molten glass decreased in the deposited films in the order: NiAl, NiAl—AlN, Ti—B—C—N to Ti—B—C. The critical wetting temperatures of molten glass on NiAl, NiAl—AlN, Ti—B—C—N, and $TiB_2$—TiC thin films were determined to be 1078° C., 1064° C., 1050° C., and 1027° C., respectively. Overall, NiAl exhibited the most preferable non-sticking coating properties by molten glass. The critical wetting temperature of NiAl by molten glass is about 100° C. higher than that of AISI 304 stainless steel, and the adhesion energy of molten glass on a NiAl film is about half that of molten glass on AISI 304 stainless steel.

Both the dynamic and isothermal oxidation kinetics of these working layers was studied using differential scanning calorimetry (DSC) and thermogravimetric analysis (TGA). The oxide compositional depth profile, structure, and morphology were characterized by Rutherford backscattering spectrometry (RBS), XRD, and SEM, respectively. The oxidation resistance of Ti—B—C and Ti—B—C—N films was approximately the same, while that of the NiAl films was determined to be the best of all films studied. In the dynamic oxidation studies, NiAl, Ni—Al—N, Ti—B—C, and Ti—B—C—N thin films exhibited good oxidation resistance at elevated temperatures, up to 1100° C., 1050° C., 800° C., and 750° C., respectively. The isothermal oxidation of NiAl obeyed a logarithmic rate law at temperatures of 900° C. and 975° C., and a parabolic law at temperatures of 1050° C. and 1100° C. For isothermal oxidation of the NiAl thin film in air at 1100° C., θ-$Al_2O_3$ was the predominant oxide in the mature scales, while the rate-controlling step was the outward diffusion of Al ions in the oxide scale. NiAl showed excellent oxidation resistance at elevated temperatures (up to 1100° C.). The activation energies for oxidation were determined to be about 3.6 eV/atom.

Mechanical properties, including hardness, Young's modulus, film adhesion to substrate and residual stress, were investigated together with their tribological behavior of the coating systems of the present invention. The best properties and performance were achieved by depositing a coating with a 50 nm thick titanium interlayer and using a substrate bias of −50 volts for the total coating system. Overall, the Ti—B—C film and the Ti—B—C—N film (containing about 10% nitrogen) exhibited the best adhesion and best tribological performance. The critical load of adhesion failure, volumetric wear factor and friction coefficient of Ti—B—C films on AISI 304 stainless steel substrates were determined to be 43 Newtons, $2.1 \times 10^{-5}$ mm$^3$/(N·m), and 0.32, respectively, using scratch testing.

These experiments identified NiAl to be the most promising working layer in terms of non-sticking and oxidation resistant properties while the Ti—B—C film and the Ti—B—C—N film (containing about 30% nitrogen in the film) exhibited the best adhesion and best wear and tribological performance.

Additionally, finite element analysis (FEA) was developed to simulate the service conditions in an effort to minimize experimental trial and error and as a means of identifying an optimized coating architecture in terms of the integrity, reliability and performance of a coated die during a simulated glass molding process.

Figure 2:
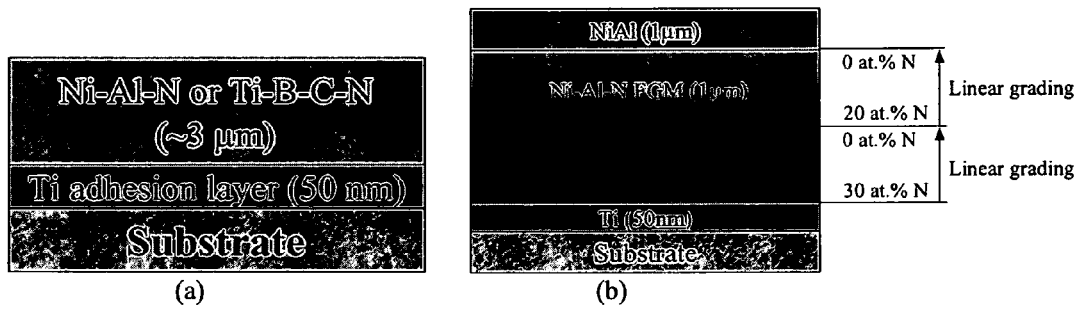
FIG. 2 shows a schematic of a preferred coating system of the present invention developed for glass molding dies and forming tools: (a) a simple coating architecture and (b) a graded coating architecture. Note that Ni—Al—N refers to all compositions from the binary NiAl to ternary Ni—Al—N, and Ti—B—C—N refers to all compositions from ternary Ti—B—C to quaternary Ti—B—C—N.

Based on these experiments conducted to evaluate properties of candidate coatings and finite element analysis conducted to propose the optimal coating architecture with minimized residual stresses and an optimized stress distribution, the coating systems schematically depicted in FIG. 2 were constructed to provide the best accommodation of chemical, physical, and mechanical properties desired to achieve high performance and reliability for glass molding and forming applications. The simplest coating architecture (as shown in FIG. 2a) includes an adhesion layer that is in contact with the surface of a substrate tool or die. A NiAl working layer is sufficient for those applications in which the NiAl film can meet the requirements of wear resistance in which abrasive and/or erosive wear is relatively low, while a Ti—B—C—N working layer is sufficient for those glass molding or forming processes operating at relatively low temperatures less than about 700° C. or in vacuum, or in a protective environment such as a nitrogen or argon atmosphere. The graded coating architecture depicted in FIG. 2b is preferably used for coating glass molding tools and dies used for applications requiring enhanced wear resistance.

Some mechanical and tribological properties of the graded coating architecture on AISI 304 stainless steel substrates have been measured. The critical load of adhesion failure was determined to be 52 Newtons using scratch testing, which is higher than any Ni—Al—N and Ti—B—C—N films with a titanium adhesion layer deposited on AISI 304 stainless steel substrate. The volumetric wear factor was determined to be $1.9 \times 10^{-5}$ mm$^3$/(N·m) using a multipass wear test. This is lower than any of the Ni—Al—N or Ti—B—C—N N monolithic films examined. The friction coefficient was determined to be 0.4, which is approximately the same as the Ti—B—C—N films with titanium adhesion layer produced in this work. In addition, the NiAl outmost layers provides the required non-sticking and oxidation resistant properties for operations at high temperature and in air.

The success of these coatings depends upon the synergy of the properties of each layer to provide an optimum combination of functionality to meet the application requirements. Therefore, another embodiment of the present invention is a coating having an inner-most layer that enhances the coating adhesion to a substrate and a NiAl or Ti—B—C—N outer layer that serves as a non-sticking and oxidation-resistant working layer. In a preferred embodiment, the coating also contains FGM Ti—B—C—N and/or FGM Ni—Al—N interlayer or layers between the inner-most and outer layers. These FGM interlayers enhance the wear performance of the entire coating and provide gradually changing properties from the inner-most layer to the outer working layer, as well as the best accommodation of residual stresses generated in the coating system during glass molding processes.

The inner most layer or "adhesion layer" is a layer of reactive elements, which can promote chemical interactions at the interface between the film and the substrate surface to form chemical bonds for good adhesion. For example, elements such as titanium (Ti), chromium (Cr), tungsten (W), or combinations of these elements, are well suited to form the adhesion layer in the coatings of the present invention. Typically, the adhesion layer has a thickness of between about 50 nm and about 200 nm. This adhesion layer makes contact with the substrate. The substrate may be any material typically used for dies or tools including, but not limited to, cast iron, stainless steel, platinum, tungsten carbide or silicon. Preferably, the thickness of the adhesion layer is between about 50 nm and about 100 nm. Most preferably, the adhesion layer is about 50 nm thick.

The outer most layer or "working layer" is a material that provides good wettability characteristics with molten glass. This working layer may be a Ti—B—C—N composite film or a NiAl intermetallic film. Preferably, the working layer is a coating containing NiAl, which has been found in wettability tests to be the best working layer that interfaces with molten glass in ambient environment. Most preferably the working layer is a NiAl intermetallic film. This working layer provides excellent non-sticking characteristics by molten glass and oxidation resistance at temperatures up to about 1100° C. However, if the glass molding or forming process is operated at low temperatures (for example, less than about 700° C.) or in vacuum or in a protective atmosphere (such as nitrogen or argon), the Ti—B—C—N coating has been found to be an excellent working layer. The working layer has a thickness of between about 0.25 µm and about 5 µm. Preferably, the thickness of the working layer is between about 0.5 µm and about 2 µm.

In the embodiment in which a functionally graded material (FGM) layer or layers, or graded "interlayers," are present, these interlayers may be Ti—B—C—N and/or Ni—Al—N composites. In these layers, the nitrogen content is graded from about 0% nitrogen to at least about 20 atomic percent nitrogen or to at least about 30 atomic percent nitrogen. Preferably, the nitrogen content is graded from about 0% nitrogen to about 20 atomic percent for Ni—Al—N layers and from about 0% nitrogen to about 30 atomic percent for Ti—B—C—N layers. Preferably, these interlayers have a graded nitrogen content from about 0% at the upper-most surface of the layer (closest to the working layer) to the higher content of nitrogen at the inner-most surface of the layer (closest to the adhesion layer). In the embodiments of the present invention in which only one interlayer is utilized, this grading would therefore vary from about 0% nitrogen at the surface of the interlayer that makes contact with the working layer, to the higher content of nitrogen at the surface of the interlayer that makes contact with the adhesion layer. The nitrogen content is preferably varied in a linearly or sinusoidal manner across the graded interlayer.

As described in detail supra, the FGM layer of Ti—B—C—N can be produced by sputtering from a TiB$_2$—TiC composite target in an argon-nitrogen atmosphere while changing the nitrogen content in the Ti—B—C—N film from about thirty atomic percent nitrogen to about zero percent nitrogen over a period of the deposition time. While changing the nitrogen content during this process, it is preferable to vary the nitrogen content continuously in either a linear or sinusoidal manner. The FGM layer of Ni—Al—N is deposited using the same technique with a NiAl composite target, but with a different period of deposition time because of the difference of deposition rates between Ni—Al—N films and Ti—B—C—N films.

Each individual FGM intermediate layer has a thickness of between about 0.25 µm and about 10 µm. Preferably, the thickness of the FGM intermediate layer is between about 0.5 µm and about 5 µm. Most preferably, the intermediate layer is about 3 µm thick and contains both a graded Ti—B—C—N layer and a graded Ni—Al—N layer, in which the Ti—B—C—N graded layer is about 2 µm thick and the Ni—Al—N graded layer is about 1 µm thick. In the graded coating architecture, the graded Ni—Al—N and/or graded Ti—B—C—N layers beneath the working layer enhances wear resistance, and provides accommodation and minimization of residual thermal stresses produced by the shot cycling of the glass molding process. The titanium adhesion layer minimizes residual deposition stresses and improves adhesion of the coating system to the die substrate. Therefore, the graded coating architecture gives higher critical load and better wear resistance, and thus enhances the integrity, reliability and performance of the coated systems.

The coatings if the present invention can be applied to any type of die or tool material. The coatings are best adapted for application on tools and dies used in glass molding or forming processes, such as cast iron, stainless steel, platinum, tungsten carbide, or silicon. Thus, another embodiment of the present invention is a tool or die coated with one of the coatings of the present invention. Preferably, these tools or dies are glass molding or forming tools or dies.

The coatings of the present invention effectively provide higher glass product quality and productivity, higher possible glass molding process temperatures without die fatigue or failure, closer control of dimensional tolerances of glass product, longer service life of dies and tools and lower cost of die manufacturing because of the cheaper elements used in the system.

This unique coating system based on a novel architecture makes the forming tools oxidation resistant and wear resistant at high temperatures and provides a surface to which glass does not stick. These properties in the tools allow the production of glass components without interruption and material loss, and thus the life of a tool and the quality and productivity of glass products to be significantly extended. This new coating architecture and design is particularly suited for precision glass molding or forming processes.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, are within the scope of the present invention. The embodiment described hereinabove is further intended to explain the best mode known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. A coating for a die or a tool comprising:
   an adhesion layer that makes contact with a surface of a substrate; and,
   an outer most working layer that makes contact with the adhesion layer, wherein the working layer is an intermetallic film comprising at least one of Ni—Al and Ti—B—C—N.

2. The coating of claim 1, wherein the working layer has a thickness of between about 0.25 micrometers and about 5 micrometers.

3. The coating of claim 1, wherein the working layer has a thickness of between about 0.5 micrometers and about 2 micrometers.

4. The coating of claim 1, wherein the adhesion layer comprises at least one reactive element.

5. The coating of claim 1, wherein the adhesion layer comprises at least one of titanium, chromium and tungsten.

6. The coating of claim 1, wherein the adhesion layer has a thickness of between about 25 nanometers and about 200 nanometers.

7. The coating of claim 1, wherein the adhesion layer has a thickness of between about 50 nanometers and about 100 nanometers.

8. The coating of claim 1, wherein the surface comprises at least one of cast iron, stainless steel, platinum, tungsten carbide and silicon.

9. The coating of claim 1, further comprising at least one functional graded material interlayer between the working layer and the adhesion layer.

10. The coating of claim 9, wherein the at least one functional graded material interlayer comprises at least one of a Ti—B—C—N composite layer and a Ni—Al—N composite layer.

11. The coating of claim 10, wherein the at least one functional graded material interlayer comprises a graded nitrogen content in the film from about 0 atomic percent nitrogen to at least about 20 atomic percent nitrogen.

12. The coating of claim 10, wherein the at least one functional graded material interlayer comprises a graded nitrogen content in the film from about 0 atomic percent nitrogen to at least about 30 atomic percent nitrogen.

13. The coating of claim 10, wherein the graded nitrogen content varies linearly across the at least one functional graded material layer.

14. The coating of claim 10, wherein the graded nitrogen content varies sinusoidally across the at least one functional graded material layer.

15. The coating of claim 9, wherein the at least one functional graded material interlayer comprises a composite selected from the group consisting of Ti—B—C—N and Ni—Al—N composites, and
   wherein the nitrogen content of the composite is graded from about 0 atomic percent nitrogen at a surface of the at least one functional graded material interlayer closest to the working layer to at least about 20 atomic percent nitrogen at a surface of the at least one functional graded material interlayer closest to the adhesion layer.

16. The coating of claim 9, wherein the at least one functional graded material interlayer comprises a Ni—Al—N composite layer and a Ti—B—C—N composite layer, and
   wherein the nitrogen content of the Ni—Al—N composite layer is graded from about 0 atomic percent nitrogen at a surface of the at least one functional graded material interlayer closest to the working layer, to at least about 20 atomic percent nitrogen at a surface of the at least one functional graded material interlayer closest to the adhesion layer, and
   wherein the nitrogen content of the Ti—B—C—N composite layer is graded from about 0 atomic percent nitrogen at a surface of the at least one functional graded material interlayer closest to the working layer, to at least about 30 atomic percent nitrogen at a surface of the functional graded material interlayer closest to the adhesion layer.

17. The coating of claim 9, wherein the at least one functional graded material interlayer comprises at least one composite selected from the group consisting of Ti—B—C—N, Ti—B—C, Ni—Al—N and Ni—Al.

18. The coating of claim 9, wherein the at least one functional graded material interlayer has a thickness of between about 0.25 micrometers and about 10 micrometers.

19. The coating of claim 9, wherein the at least one functional graded material interlayer has a thickness of between about 0.5 micrometers and about 5 micrometers.

20. A coating for a die or a tool comprising:
an adhesion layer that makes contact with a surface of a substrate, and
an outer most working layer that makes contact with the adhesion layer, wherein the working layer comprises at least one of Ni—Al—N and Ti—B—C—N.

21. The coating of claim 20, wherein the working layer has a thickness of between about 0.25 micrometers and about 5 micrometers.

22. The coating of claim 20, wherein the working layer has a thickness of between about 0.5 micrometers and about 2 micrometers.

23. The coating of claim 20, wherein the working layer comprises a Ni—Al—N intermetallic film.

24. The coating of claim 20, wherein the working layer comprises a Ti—B—C—N composite film having variable $TiB_2$—TiC composite targets.

25. The coating of claim 24, wherein the $TiB_2$—TiC composite targets comprise a $TiB_2$:TiC ratio from about 40:60 to about 80:20.

26. The coating of claim 20, wherein the adhesion layer comprises at least one reactive element.

27. The coating of claim 20, wherein the adhesion layer comprises at least one of titanium, chromium and tungsten.

28. The coating of claim 20, wherein the adhesion layer has a thickness of between about 25 nanometers and about 200 nanometers.

29. The coating of claim 20, wherein the adhesion layer has a thickness of between about 50 nanometers and about 100 nanometers.

30. The coating of claim 20, wherein the surface comprises at least one of cast iron, stainless steel, platinum, tungsten carbide and silicon.

31. The coating of claim 20, further comprising at least one functional graded material interlayer between the working layer and the adhesion layer.

32. The coating of claim 31, wherein the at least one functional graded material interlayer comprises at least one of a Ti—B—C—N composite layer and a Ni—Al—N composite layer.

33. The coating of claim 32, wherein the at least one functional graded material interlayer comprises a graded nitrogen content in the film from about 0 atomic percent nitrogen to at least about 30 atomic percent nitrogen.

34. The coating of claim 33, wherein the graded nitrogen content varies linearly across the at least one functional graded material layer.

35. The coating of claim 33, wherein the graded nitrogen content varies sinusoidally across the at least one functional graded material layer.

36. The coating of claim 31, wherein the at least one functional graded material interlayer comprises a composite selected from the group consisting of Ti—B—C—N and Ni—Al—N composites, and
wherein the nitrogen content of the composite is graded from about 0 atomic percent nitrogen at a surface of the at least one functional graded material interlayer closest to the working layer to at least about 20 atomic percent nitrogen at a surface of the at least one functional graded material interlayer closest to the adhesion layer.

37. The coating of claim 31, wherein the at least one functional graded material interlayer comprises a Ni—Al—N composite layer and a Ti—B—C—N composite layer, and
wherein the nitrogen content of the Ni—Al—N composite layer is graded from about 0 atomic percent nitrogen at a surface of the at least one functional graded material interlayer closest to the working layer, to at least about 20 atomic percent nitrogen at a surface of the at least one functional graded material interlayer closest to the adhesion layer, and
wherein the nitrogen content of the Ti—B—C—N composite layer is graded from about 0 atomic percent nitrogen at a surface of the at least one functional graded material interlayer closest to the working layer, to at least about 30 atomic percent nitrogen at a surface of the at least one functional graded material interlayer closest to the adhesion layer.

38. The coating of claim 31, wherein the at least one functional graded material interlayer comprises at least one composite selected from the group consisting of Ti—B—C—N, Ti—B—C, Ni—Al—N and Ni—Al.

39. The coating of claim 31, wherein the at least one functional graded material interlayer has a thickness of between about 0.25 micrometers and about 10 micrometers.

40. The coating of claim 31, wherein the at least one functional graded material interlayer has a thickness of between about 0.5 micrometers and about 5 micrometers.

41. A coating for a die or a tool comprising:
an adhesion layer that makes contact with a surface of a substrate;
a working layer that makes contact with the adhesion layer, wherein the working layer comprises Ni—Al; and,
at least one functional graded material interlayer between the working layer and adhesion layer, wherein the at least one functional graded material interlayer comprises at least one of Ni—Al—N and Ti—B—C—N.

42. The coating of claim 41, wherein the at least one functional graded material interlayer comprises a graded nitrogen content in the film from about 0 atomic percent nitrogen to at least about 30 atomic percent nitrogen.

43. The coating of claim 41, wherein the graded nitrogen content varies linearly across the at least one functional graded material layer.

44. The coating of claim 41, wherein the graded nitrogen content varies sinusoidally across the at least one functional graded material layer.

45. The coating of claim 41, wherein the at least one functional graded material interlayer comprises a composite selected from the group consisting of Ti—B—C—N and Ni—Al—N composites, and
wherein the nitrogen content of the composite is graded from about 0 atomic percent nitrogen at a surface of the at least one functional graded material interlayer closest to the working layer to at least about 20 atomic percent nitrogen at a surface of the at least one functional graded material interlayer closest to the adhesion layer.

46. The coating of claim 41, wherein the at least one functional graded material interlayer comprises a Ni—Al—N composite layer and a Ti—B—C—N composite layer, and wherein the nitrogen content of the Ni—Al—N composite layer is graded from about 0 atomic percent nitrogen at a surface of the at least one functional graded material interlayer closest to the working layer, to at least about 20 atomic percent nitrogen at a surface of the at least one functional graded material interlayer closest to the adhesion layer, and wherein the nitrogen content of the Ti—B—C—N composite layer is graded from about 0 atomic percent nitrogen at a surface of the at least one functional graded material interlayer closest to the working layer, to at least about 30 atomic percent nitrogen at a surface of the at least one functional graded material interlayer closest to the adhesion layer.

47. The coating of claim 41, wherein the at least one functional graded material interlayer comprises at least one composite selected from the group consisting of Ti—B—C—N, Ti—B—C, Ni—Al—N and Ni—Al.

48. The coating of claim 41, wherein the at least one functional graded material interlayer has a thickness of between about 0.25 micrometers and about 10 micrometers.

49. The coating of claim 41, wherein the at least one functional graded material interlayer has a thickness of between about 0.5 micrometers and about 5 micrometers.

* * * * *